United States Patent [19]

Mitchell

[11] 3,790,870

[45] Feb. 5, 1974

[54] THIN OXIDE FORCE SENSITIVE SWITCHES

[76] Inventor: Robert J. Mitchell, 1180 E. Rubio St., Altadena, Calif. 91001

[22] Filed: Mar. 11, 1971

[21] Appl. No.: 123,245

[52] U.S. Cl. ......... 317/238, 317/234 N, 317/234 P, 317/235 M, 338/22

[51] Int. Cl. ............................ H01l 3/00, H01l 5/00

[58] Field of Search ...... 317/234, 26, 1, 5, 5.4, 238, 317/101 C; 338/22, 99

[56] References Cited

UNITED STATES PATENTS

| | | | |
|---|---|---|---|
| 1,809,925 | 6/1931 | Edwards | 317/234 |
| 3,188,537 | 6/1965 | Wentorf | 317/234 |
| 3,611,068 | 10/1971 | Fujita | 317/235 |
| 1,877,482 | 9/1932 | Ruben | 338/99 |
| 1,640,335 | 8/1927 | Grondahl | 317/238 |
| 1,861,083 | 5/1932 | Geiger et al. | 317/238 |
| 1,976,556 | 10/1934 | Harty | 317/238 |
| 2,036,707 | 4/1936 | Lazarus | 317/238 |
| 2,946,927 | 7/1960 | Silver et al. | 317/101 C |
| 3,518,508 | 6/1970 | Yamashita et al. | 317/235 M |
| 3,544,857 | 12/1970 | Byrne et al. | 317/101 CP |

FOREIGN PATENTS OR APPLICATIONS

| | | | |
|---|---|---|---|
| 700,611 | 12/1940 | Germany | 317/238 |

*Primary Examiner*—Andrew J. James
*Attorney, Agent, or Firm*—Fraser & Bogucki

[57] ABSTRACT

A new class of bi-stable solid state switching devices, designated Force Switchable Diodes or FSD's, are provided by copper/cuprous oxide rectifying or "blocking" junction devices, exemplified in elemental form by a copper substrate, a contacting thin cuprous oxide layer and the interface between them, such devices are arranged to avalanche from a blocking state to an essentially conducting state on the application of force when under a related voltage, and avalanche back to a blocking state on the removal of at least a portion of that force. The transition between the states is sharp, predictable and free of arcing effects. A single copper/cuprous oxide junction provides unidirectional switching, and an assembly comprising a set of copper/cuprous oxide/copper junctions provides bi-directional switching or polarity insensitivity. De-switching does not require a reduction of applied voltage, nor does switching require an increase in applied voltage. Force Switchable Diodes, however, provide an inverse relationship between switching force and voltage, and a positive relationship between switching force and thickness of the cuprous oxide layer. The invention provides for both discrete switches and integrated matrix switching arrays, and further comprises mechanical and electrochemical methods of forming blocking junctions.

22 Claims, 17 Drawing Figures

THIN OXIDE FORCE SENSITIVE SWITCHES

BACKGROUND OF THE INVENTION

1. Field of the Invention

This invention relates to electrical components and devices and materials, and more particularly to solid state force sensitive switches.

2. Description of the Prior Art

Copper oxide rectifiers are well known and widely used for conventional purposes, and are valued for their simplicity of series and parallel operation, and for their high immunity to damage from voltage spikes. These rectifiers are based upon the knowledge that a layer of cuprous oxide on the surface of a copper conductor will permit the passage of electrons from the copper into the oxide, but prevents the passage of electrons from the oxide into the copper. Copper oxide rectifier devices have typically comprised a multiple laminate of relatively thick (e.g., several thousandths of an inch or more) cuprous oxide layers, bound together into a body. These rectifiers are typically assembled in the form of a succession of copper annuli of the order of an inch in diameter having cuprous oxide layers on one side, and with interposed lead annuli separating each cuprous oxide layer from the next adjacent copper element. The alternating annuli are stacked about a central non-conductive mandrel and encompassed by a sealed housing. The cuprous oxide layers are generally formed by high temperature oxidation of the copper annuli, followed by chemical or other removal of the resulting outer layer of cupric oxide.

A second body of knowledge regarding the use of copper oxide barriers in high voltage switching and sensing devices is revealed in the copending patent application, Ser. No. 724,791, which also reports many successful configurations employing oxidized surfaces on copper powders and mixtures of copper powders with cuprous oxide powders. The principal operating mechanism in this class of device is quite different from that of the present concept in that progressive compression of the powders creates a progressively shorter electrical path between electrodes, with a corresponding reduction in the number of series blocking junctions, until the applied voltage exceeds the remaining blocking capability of the powder interfaces.

A third category of prior art bears a resemblance to the present invention, but employs a totally different operating principle in that insulating oxide layers are deployed on the surfaces of conductors, and achieve switching action by mechanical breakthrough which permits direct contact between conductors. This effect is achieved with limited displacement, but is severely limited in life due to the cumulative wear of both insulating layers and the conductors.

A fourth area of prior art is the broad field of threshold switching, in which an analog device produces an electrical output proportional to an applied force, and in which said output triggers an over-centering or bistate circuit at a predetermined output level. While this category of device can achieve high reliability, it requires separate sensing and switching circuits with their attending complexity and cost.

SUMMARY OF THE INVENTION

The present invention shows that the electron blocking effect in an interface defined by facing cuprous oxide and copper strata known as a copper/cuprous oxide junction is, under certain defined condition, a function of the compressive force applied to a relatively thin cuprous oxide layer, and that an avalanche switching effect may be achieved non-destructively by compressing the layer until the voltage it can block diminishes below the applied voltage. De-switching or the restoration of the original voltage blocking capability, occurs on the removal of at least a portion of the compressive force. Unlike conventional switching diodes, devices in accordance with this invention do not require a reduction or reversal of applied voltage to deswitch. They are particularly useful in manual control (e.g., key actuation) systems.

Also in accordance with this invention, unidirectional switching can be provided with copper/cuprous oxide/non-copper layers arranged for compressively loading at least a portion of the junctions thus formed, and bi-directional switching can be provided with copper/cuprous oxide/copper layers that may be compressively loaded. Both single- and bi-directional switching devices can employ multiple layers of the preceding blocking junctions to block and switch higher voltages since they exhibit excellent series operating characteristics. Devices achieving such force sensitive switching effects have been named Force Switchable Diodes, or FSD's for convenience. They may also be characterized as being piezo avalanche devices.

Devices in accordance with this invention exhibit an extremely low voltage drop in the switched state, therefore have little heating, and further have virtually zero leakage in the unswitched or blocking state, and extremely fast switching times. In general, these values, respectively, are 0.1 to 0.25 volt drop, less than 1 microampere leakage at 6 volts, and less than 1 microsecond switching time. There are indications that switching times below 1 nanosecond are possible, especially where electrode configurations with very low capacitance are employed. Low generation of internal heat, due to this combination of favorable characteristics, means that it is seldom necessary to make special provisions for its removal. Devices in accordance with the invention are particularly of advantage because they switch under typical modern circuit conditions in response to convenient manual force variations. The junction areas may also be very small, and various novel devices using matrices are shown and described. The thickness of the oxide layer has an important effect on the voltage blocking ability of the junction, with an exponential increase of blocking capability with increasing thickness, and also has an important effect on the force which will cause avalanche switching the FSD. Typical thickness of the oxide layer is between 0.0001 inch and 0.001 inch, a preferred range being from 0.0002 inch to 0.0006 inch.

Force responsive switches responsive to manual key operation in modern electronic systems may take any of a number of forms. In one specific example, printed circuit conductors on a substrate have opposed, spaced apart terminations which are bridged by a copper shunt electrode having a facing thin cuprous oxide layer contacting the conductors, the assembly being sealed peripherally. A voltage difference existing on the conductors, of either polarity, is blocked by one copper/cuprous oxide interface when no compressive force is exerted on the shunt electrode. As increasing compressive force is exerted, a predictable piezo avalanche point is reached at which the junction no longer blocks current. When the force is released, without change of voltage, the junction deavalanches in similar fashion. In another specific example, a cylindrical center electrode is encompassed by and mechanically supports an outer concentric element. A disk element disposed transversely across the end of the structure receives compressive force acting on the end of the center electrode, with a copper/cuprous oxide junction being disposed therebetween. This arrangement is particularly advantageous where cure shrinkage problems impose undue mechanical loading.

Barrier layers may be formed, in further accordance with this invention, by one or a combination of steps such as the following: Electrolytic oxidation of copper electrodes and/or elements; and by mechanical impregnation of cuprous oxide powders in and/or between soft metal elements. Uniform loading over the compression faces, as well as a reduction of surface precision requirements, may be achieved by interposing soft conductors between the oxide barriers and the compressing electrode.

In addition to discrete switches, the FSD concept and principle is further applicable to integrated arrays of switches. In one example, a flexible plane of parallel "X" conductors electrically insulated from one another are separated from a second set of parallel co-planar "Y" conductors (disposed at approximately right angles to the first conductors) by at least one layer of copper/cuprous oxide junctions of small area. Such a matrix array provides a useful means of encoding graphical or planar position data as defined by the position of a mechanically or manually manipulated element, for storage, transmission and/or data processing. Data entry is by compression of discrete "X" and "Y" intersections by means of a stylus, embossed credit card, or similar means.

Both discrete and integrated devices made in accordance with this invention are inherently long-lived due to their ability to provide "snap-acting" switching without complex over-centering mechanisms, their high immunity to voltage spikes, and their negligible wear rate in pure compression. Specific FSD devices in accordance with this invention can be varied extensively to meet mechanical, electrical and cost requirements.

BRIEF DESCRIPTION OF THE DRAWINGS

A better understanding of the invention may be had by reference to the following detailed description, taken in conjunction with the accompanying drawings, in which.

DETAILED DESCRIPTION OF THE INVENTION

Figures 1, 2:
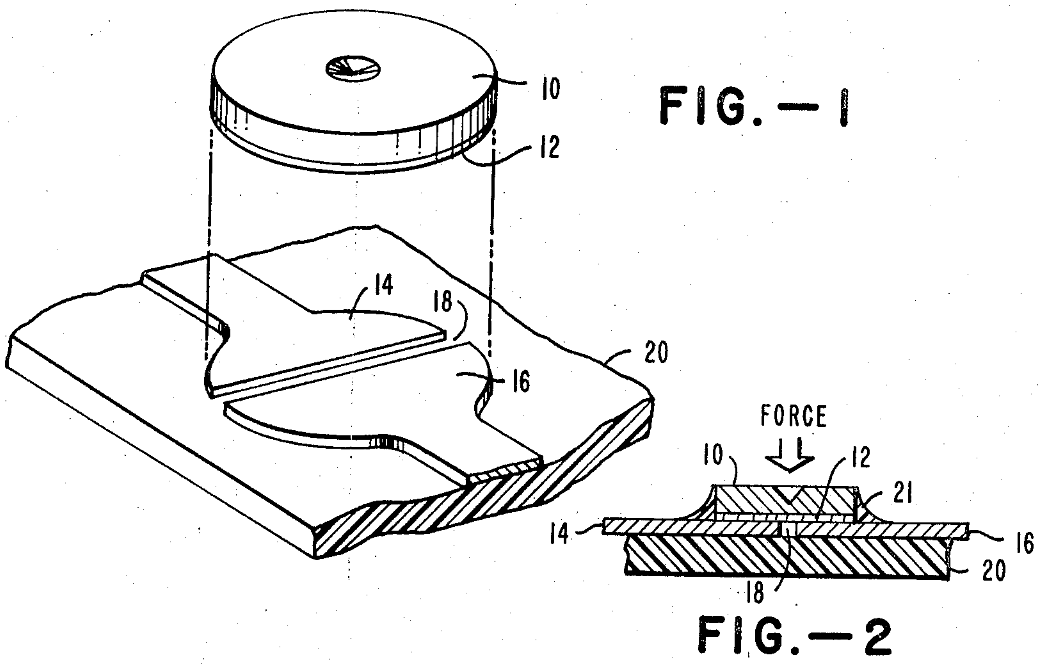
FIG. 1 is a perspective exploded view of a piezo avalanche FSD switch in accordance with this invention incorporated into a printed circuit board, utilizing a single oxide barrier on a shunt electrode.
FIG. 2 is a side sectional view of the device of FIG. 1.
Figure 3:
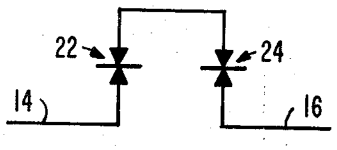
FIG. 3 is an idealized simplified representation of the circuit inherent in the switch of FIG. 1 when in the blocking state.
Figure 4:
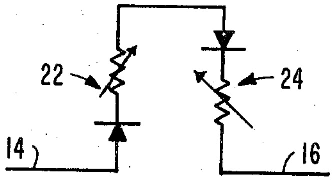
FIG. 4 is an idealized simplified representation of a typical current flow path through the FSD device in FIG. 1 when in the switched or conductive state.

One form of a piezo avalanche FSD switch in accordance with the invention is shown in FIGS. 1 and 2, with the electrical blocking and conductive states shown in FIGS. 3 and 4, to all of which Figures reference is now made. This form of the invention is adapted particularly for multiple switches to be mounted directly on printed circuit boards and/or switches to be fabricated on small sections of printed circuit boards. A copper shunt electrode 10 bears a thin cuprous oxide layer 12. A pair of printed circuit electrodes 14 and 16 are disposed in the same plane on a printed circuit board substrate 20, and are separated by a gap 18 which is ideally several times the thickness of the oxide layer 12. A voltage difference on the printed circuit electrodes 14, 16 represents the signal to be activated. The oxide layer 12 is usually but not necessarily formed on the lower surface of the copper shunt electrode 10, which is disposed to cover and contact at least a portion of both printed circuit electrodes 14 and 16. The cuprous oxide layer 12 may be formed only on the shunt electrode 10, only on the printed circuit electrodes 14 and 16 (when copper), or both on the printed circuit electrodes 14 and 16 and on the shunt electrode 10. If the latter alternative is selected, it is desirable and typically necessary to reduce the individual thickness of the multiple barriers thus formed to avoid excessive switching force requirements at the required operating voltage. Voltage sources and the mechanism or means (including manual actuation) for compressively loading the unit by acting against the upper surface of the shunt electrode 10 have not been shown.

In this example, the shunt electrode 10 is in contact with the co-planar electrodes 14 and 16 as shown in FIG. 2, and permanently mounted and sealed by an annular bead of flexible glue or sealant 21. Prior to the application of force to the shunt electrode 10, the blocking action of the switch assembly may be represented graphically as two pairs of back-to-back diodes or rectifiers 22 and 24 as shown in FIG. 3. When sufficient switching force is applied as shown in FIG. 2, the two diodes which oppose the applied voltage will avalanche and permit a very rapid rise of current even though the electrons now flow freely from the oxide into the copper, contrary to their characteristic when the barriers are in the unstressed state. FIG. 4 illustrates this change of state as a diode feeding from the electrode 14 through a variable resistance into the shunt electrode 10, back through a second variable resistance and a second diode into the output electrode 16. The resistance range of the two variable resistances is a function of the thickness and purity of the cuprous oxide barrier 12, and of the applied force.

The cuprous oxide layer itself functions only as a semiconductive resistive material, whereas the junction defined by the facing copper stratum and the cuprous oxide stratum generally denoted herein as the copper/cuprous oxide junction forms the blocking junction to voltage of the proper polarity. When the oxide layer is sufficiently stressed by compression, it appears that the field effect of the applied voltage overcomes the obstruction to current flow in what may be called a piezo avalanche action. The preferred range of thickness for the cuprous oxide is from approximately 0.0002 inch to 0.0006 inch for the most used voltage range from 6–12 volts. Thickness less than 0.0001 inch is not generally desirable because of inadequate physical resistance to wear and stress, but can be used in a multi-layer configurations or where shorter life is acceptable. In such configurations the blocking effect is determined by the total effective thickness of the series of cuprous oxide layers. In all instances, the magnitude of compressive stress at the point of avalanche decreases as voltage increases. Thus, greater sensitivity can be obtained simply by voltage increase. Where ultimate precision is required, the depth of migration or penetration at the interface should be accounted for in determining the effective thickness of the cuprous oxide layer.

An optimum configuration of a switch built corresponding to the example of FIG. 1 for electronic keyboard applications, operating at 5 to 6 volts, AC or DC, comprises:

an epoxy/fiberglass substrate 20, 1/16 inch or thicker;

copper conductors (electrodes) 14 and 16 whose circle diameter is approximately ¼ inch, separated by a gap 18 of approximately 0.010 inch;

a copper shunt electrode 10, also ¼ inch diameter, on which the oxide barrier 12 is approximately 0.0002 inch thick; and, a silicone rubber seal 21 disposed around the periphery of shunt electrode 10 to mechanically retain and seal the electrodes 10, 14 and 16 and the barrier layer 12 from moisture, oxygen and other contaminants, and cured at a temperature close to the designed operating temperature of the switch (to avoid false loading incurred by post-cure shrinkage).

The switch in this optimized example can be manufactured at low cost, may be operated at 50 milliamperes for prolonged periods, and can be actuated by application of approximately 3 ounces compressive force.

Since the FSD switch in this example is bidirectional, a reversal of the voltage polarity results only in the reversal of the function of the conducting and blocking diodes. It should be noted that only one blocking diode is required for DC switching if its unstressed voltage blocking ability exceeds the applied voltage; and only two diodes, back-to-back, are required to block and switch AC voltages. The configuration illustrated in FIGS. 1–4, however, is of special interest due to its low manufacturing cost and extremely low "installation" cost. In applications where the cuprous oxide barrier is formed directly on copper electrodes 14 and 16, the shunt electrode 10 may be formed of non-copper conductor and the FSD assembly thus provides a single pair of back-to-back diodes. The same result would be obtained by a copper shunt electrode 10 with an oxide barrier 12 when the printed circuit electrodes 14 and 16 are non-copper conductors. It should also be noted that the FSD effect is tolerant of substantial impurity levels where the oxides of those impurities are insulating and/or exhibit very high resistance (for example: silicon, lead, aluminum, strontium, and others). The effects of such impurities in an oxidized surface appear primarily as an increase in switching force for a given voltage and barrier thickness. It is important, however, to avoid impurities whose oxides are conductive (such as cadmium and silver), and excessive oxidation of the copper to form black cupric oxide, which destroys the FSD effect by insulating the junction.

It should be particularly noted that the FSD avalanching effect is achieved without metal-to-metal contact through the cuprous oxide barrier, and all constructions should be avoided that would permit penetration of said barrier layer. COnstructions which permit encroachment of oxygen and/or moisture into the barrier should also be avoided, since cuprous oxide can be further oxidized to cupric oxide by soldering heat or circuit generated heat in the presence of oxygen, and cuprous oxide is slightly hygroscopic and could form additional cuprous oxide by electrolysis during operation (in extreme cases, this could also convert cuprous oxide to cupric oxide and destroy the FSD effect).

Figure 5:
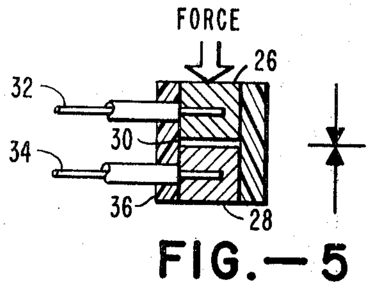
FIG. 5 is a side sectional view of a bi-directional FSD switch assembly employing two copper electrodes and one cuprous oxide barrier layer and showing an equivalent circuit therefor.

FIG. 5 illustrates a simple alternative construction of one pair of FSD switchable back-to-back diodes. In this example, two copper electrodes 26 and 28 are separated by a single or double cuprous oxide barrier layer 30, which may be formed by oxidizing one or both opposed electrode faces, or by confining a thin layer of cuprous oxide powder between those faces. Voltage is applied to electrodes 26 and 28 through coupled conductors 32 and 34, and the assembly is sealed in a retaining insulating tubular structure 36. When a voltage of either polarity is applied across the FSD switch, it is blocked by one or the other diode, as represented by an interface junction, until an applied force reduces that diode's voltage blocking capability below the level of the applied voltage, at which point the diode avalanches to a conductive and slightly resistive state. Performance almost identical to that of the optimized configuration reported in FIG. 1 has been obtained by devices comprising:

- two copper electrodes 26 and 28 approximately 0.200 inch diameter by ¼ inch long;
- an insulating acrylic tube 36 drilled to provide a slip-fit for the two electrodes 26 and 28;
- a dual cuprous oxide barrier 30, formed by electrolytically oxidizing both opposing faces presented by the contiguous electrodes 26 and 28, each to a thickness of 0.0002 inch (for a total cuprous oxide thickness of 0.0004 inch); and
- a thin planar surface sealant (not shown for simplicity) on the outside faces of both electrodes and the insulating structure (26, 28 and 36, respectively).

Similar results were obtained by configurations identical in every way except for the substitution of a compacted layer of cuprous oxide powder for the oxidized surface barriers 30. Though results were similar, greater difficulty was encountered in maintaining the cuprous oxide powder in place during prolonged operation.

Figure 6:
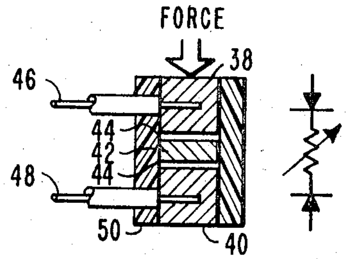
FIG. 6 is a side sectional view of a bi-directional FSD switch assembly employing two copper electrodes, two cuprous oxide barrier layers, and an intermediate soft metal (non-copper) stress equalizing layer and showing an equivalent circuit therefor.

FIG. 6 illustrates an alternative configuration almost identical to that in FIG. 5, but with two copper electrodes 38 and 40 separated by a soft metal conductor 42 (e.g., lead) into which cuprous oxide powder has been mechanically entrained to form thin barrier layers 44. The barrier layers 44 are coined or embossed into the soft metal disk 42 by mechanical force, and have proved capable because of the inherent conformability of this structure of providing the switching function for many millions of cycles at low switching force. It should be noted that the same effect can be obtained by oxidizing the contiguous faces of electrodes 38 and 40 and utilizing the soft metal conductor 42 as a means of equalizing force distribution over the said faces, thus minimizing the effects of minor surface irregularities. In either case, the effect is a single pair of back-to-back FSD diodes similar to those in FIG. 5 but with slightly higher variable resistance in the switched state. Voltage is applied through conductors 46 and 48 to electrodes 38 and 40, respectively.

The configuration shown in FIg. 6 can also be employed with finely divided copper powder, surface coated with cuprous oxide, mechanically impregnated into the surface of the soft metal disk 42. This configuration may exhibit higher electrical noise on switching and de-switching, but may be desired when high sensitivity is required.

Where the configuration illustrated in FIG. 6 is to be used for prolonged periods (upwards of approximately 25 million cycles), it is desirable to employ a disk 42 of a mechanically strong metal such as iron or steel, which in turn is plated with the soft metal conductor. This inner "skeleton" prevents excessive cold flow of the soft metal under repeated compressions, thereby minimizing the possibility of mechanical jamming of the assembly and/or exposure of bare metal to electrode contact.

Figure 7:
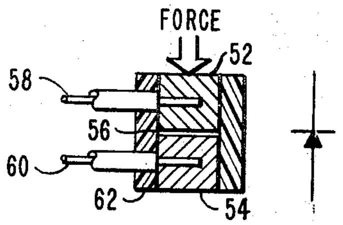
FIG. 7 is a side sectional view of a uni-directional FSD switch assembly employing one copper electrode, one cuprous oxide barrier layer, and one non-copper electrode and showing an equivalent circuit therefor.
Figure 8:
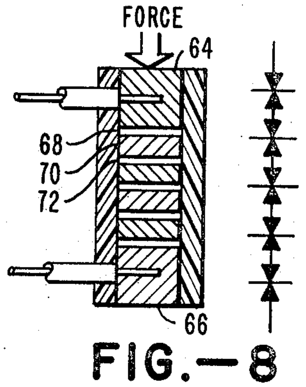
FIG. 8 is a side sectional view of a multi-layer bidirectional FSD switch assembly employing two copper electrodes and multiple oxide coated copper disks stacked in electrical and mechanical series between said electrodes for enhanced voltage blocking capability and showing an equivalent circuit therefor.

FIG. 7 illustrates a single switchable diode for use in DC circuits, or in AC circuits where it is desired to pass current freely in one direction but to block the opposite flow until the FSD is mechanically switched. In this example, an upper electrode 52 is a non-copper conductor, and a lower electrode 54 is copper with a thin cuprous oxide layer 56. The cuprous oxide barrier 56 freely passes electrons into the non-copper electrode 52, but blocks reverse electron flow until its voltage threshold is lowered by compression. Voltage is applied through conductors 58 and 60, and the assembly is sealed in an insulating structure 62.

Where it is desired to block and switch higher voltages than are conveniently accommodated by a single or double barrier, the arrangement illustrated in FIG. 8 can be employed. In this example of the invention, two electrodes 64 and 66 may be either copper or non-copper. The desired number of copper/cuprous oxide junctions are achieved by stacking multiple copper disks 70 with cuprous oxide surfaces 68 and 72. The total number of barriers is the number of transitions from cuprous oxide to copper in the direction of electron flow. In the example shown, copper electrodes 64 and 66 are in electrical series with four oxidized copper disks 70 comprising the equivalent of five pairs of diodes back-to-back. In other respects, the device illustrated in FIG. 8 is similar to those in FIGS. 5, 6 and 7.

As a general rule, when oxide layers are formed by direct oxidation of a copper surface, it is desirable initially to compress the oxide layer far beyond its intended operating force range thus producing an oxide density which combines good blocking capability when unstressed with easier switching when compressed. Typical forces employed in compacting a 0.25 inch disk with 0.0004 inch oxide may be as high as 100 pounds, even though the switching force at (for example) 6 volts may be as low as three ounces. One of the primary benefits of this practice is that pre-stressing greatly limits the change of switch characteristics which would result from repetitive compression cycles. It is important to note that this practice also confirms the ability of FSD devices to tolerate severe overloads without damage, though excessive overloads may reduce the force level at which avalanche occurs.

Figure 9:
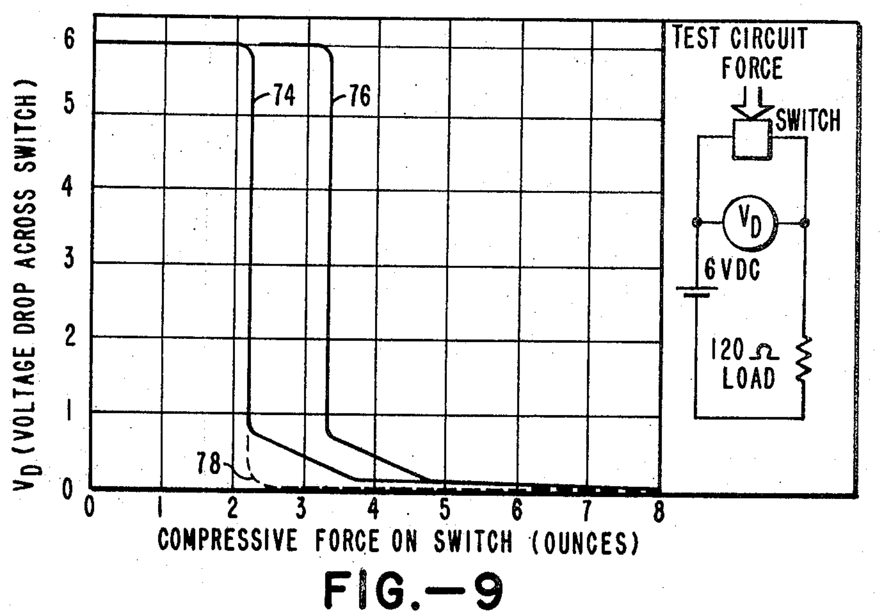
FIG. 9 is a graphical representation of force vs. voltage drop across typical FSD switching devices in accordance with this invention.

The performance achieved by FSD switches in accordance with this invention is illustrated in FIG. 9. In this graphical representation, the FSD device exhibits essentially infinite resistance to electrical flow until a predetermined force threshold is reached, at which time very rapid switching occurs. The devices tested to obtain these data are similar to those shown in FIGS. 5 and 6, with copper electrodes 0.25 inch in diameter. Employing a test circuit as shown in FIG. 9, energized by a 6-volt battery, a large number of devices were tested for force versus voltage drop characteristics. Devices employing a lead disk mechanically impregnated with cuprous oxide powder operated within the parameters described by curves 74 and 76. Devices employing copper electrodes with lightly oxidized and compacted barriers conformed more closely with curves 74 and 78. Where very thin oxide layers on the order of 0.0002 inch were used, and care was taken to avoid false loads by shrinking sealants, the very low pressure sensitivity after avalanche (curve 78) was achieved. Both types of devices are uniquely suited to electric keyboard switching, and both types have been operated well in excess of 10 million cycles at 50 milliamperes DC and six volts. (The ultimate life of these devices is yet to be determined at the time this disclosure is made.)

Figure 10:
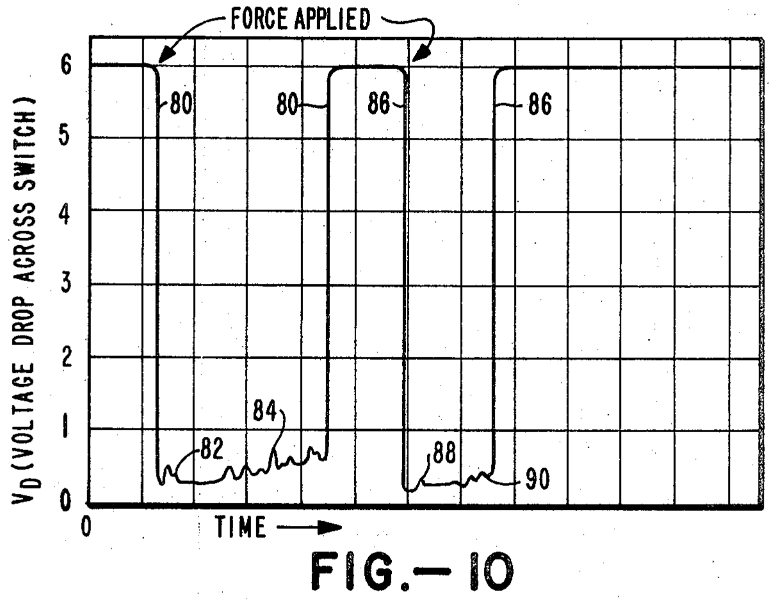
FIG. 10 is a graphical representation of time vs. voltage drop across the typical FSD switching devices of FIG. 9.

FIG. 10 graphically illustrates the switching noise typical of devices made in accordance with this invention. Curve 80 shows the rapid drop of voltage across the switch as it is actuated by compressive force, a brief low-order oscillation 82 at the terminus of the fall time, increasing noise 84 as the switching force is removed, and a sharp rise to full shut-off as the force falls below a characteristic de-switching force. Curve 86 is typical of the switching characteristics when force application and removal are more rapid. The switch-on oscillation is less pronounced (88), and the de-switching noise 90 is sharply reduced as the speed of force removal is increased. Actual rise and fall times (switching times) were observed to be less than one microsecond.

Figure 11:
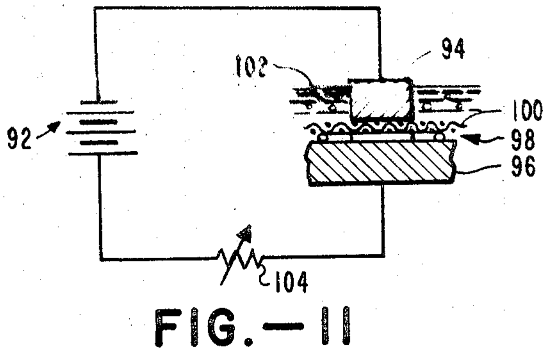
FIG. 11 is a side sectional view of an arrangement employed in methods used to form cuprous oxide barrier layers at low temperatures, electrolytically, in accordance with this invention.

FIG. 11 illustrates a structure used in a method for the formation of oxide barriers on copper surfaces at low temperatures, as may often be required when forming barriers on printed circuit electrodes. In this method, a source of direct current 92 may be connected to an electrode 94 which is positioned above a second electrode 96, with an intermediate layer of absorbent medium 100, such as blotter paper, in between. This absorbent medium 100 is maintained saturated by hydrogen peroxide solution 102. An external rheostat 104 may be placed in electrical series with the electrodes 94 and 96 to regulate the electrolyzing current. When the battery 92 positive terminal is connected to electrode 96, a barrier layer of cuprous oxide 98 grows on the surface of electrode 96 opposite to and approximately coextensive with electrode 94. Reversal of polarity will grow the cuprous oxide barrier on the entire opposed face of electrode 94. With an applied voltage of 6 volts DC, and frequent removal of liberated hydrogen, high-integrity cuprous oxide barriers 98 were formed by electrochemical reaction in approximately five minutes each. It is necessary to dry these barriers thoroughly before using them in FSD switching devices, since retained aqueous solutions or water alone could substantially alter or destroy the switching function.

While 3 percent hydrogen perioxide solution has been used primarily as the electrolyte in the electrolytic method of barrier formation, it is understood that any electrolyte of adequate conductivity which liberates high-purity oxygen at the positive electrode will serve.

In the mechanical entrainment method previously mentioned, a soft metal disk such as lead or babbitt metal is used as the substrate. It is then covered with a loose cuprous oxide powder and substantial mechanical force is exerted to coin the powder into the metal. The force may be applied on a limited area, as by peening, or by application of a compressive force to the entire surface. In a practical example of the latter technique, over 100 pounds compressive force was applied to a ¼ inch diameter substrate disk to achieve the desired entrainment. Thereafter the excess powder is removed, and a copper element may be placed against the cuprous oxide face of the substrate to form the junction.

Figures 12, 13, 14:
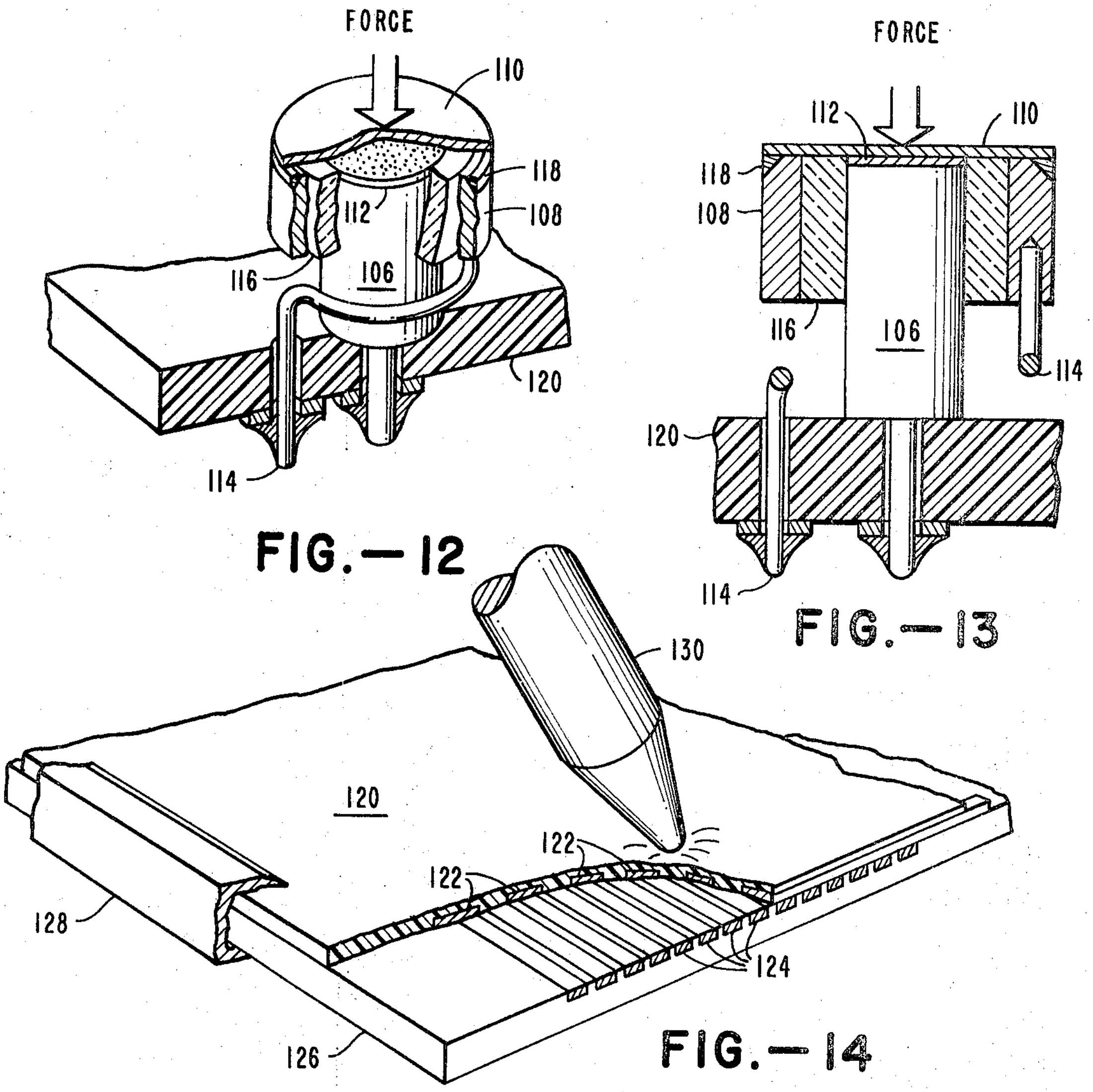
FIG. 12 is a perspective cut-away view of an FSD switch assembly designed for minimum effect of thermal cycling and for hermetic sealing against contamination of the barrier layer.
FIG. 13 is a side sectional view of the device of FIG. 12.
FIG. 14 is a perspective cut-away view of an integrated matrix array of FSD switches for graphical data encoding in accordance with this invention.

FIGS. 12 and 13 illustrate a discrete FSD switch configuration designed for connection into printed circuit boards, and for use where the most uniform switching characteristics are to be maintained under widely varying temperatures. In this embodiment, a center copper electrode 106 is mounted concentrically within an annular outer conductor 108, from which it is insulated and which it supports by a low expansion material 116, such as an electrical grade zirconium cement. If this material is cured at an elevated temperature (above anticipated operating temperature), the low expansion insulator is compressively pre-stressed and thereby able to withstand thermal cycling. A barrier layer 112 of cuprous oxide is formed on the upper surface of the center electrode 106, and capped with a copper electrode 110 which comprises a thin copper disk. The top surfaces of the barrier layer 112, the insulator 116 and ring 108 are flat and coplanar, and when the copper disk 110 is soldered in place by a peripheral solder ring 118 comprise a structure which exerts virtually no thermal stress on the oxide barrier. Increasing temperature expands the center electrode 106, the ring 108 and the disk 110 equally, resulting in a vertical force component perpendicular to barrier 112 consisting of the infinitesimal expansion of the oxide itself. The circuit path extends between a lower extension on the center electrode 106 and a conductor 114 coupled to the outer ring 108 through the copper disk 110 and the interfaces of the barrier layer 112.

Thermal expansion of the printed circuit board 120 stresses the lower conductor extension of electrode 106, but the stress is not transmitted to the barrier layer. The second conductor 114 also undergoes minor displacement by the expanding board 120, but said displacement and associated stresses are isolated from the barrier region by an elongated horizontal traverse of said conductor 114.

This construction method not only isolates thermal stresses from the barrier region, but hermetically seals said region from moisture and oxygen encroachment. Switching force is applied perpendicularly through the copper disk 110, and requires a displacement of only microns to trigger the avalanche state.

Caution is required in the soldering of the disk 110 to the ring 108 because of two considerations: All oxygen should be excluded from the space between the disk 110 and the FSD body to prevent further oxidation of the cuprous oxide to cupric oxide; and soldering fluxes should be avoided or used with extreme care, since they tend to destroy oxide films.

FIG. 14 illustrates another embodiment of the invention, comprising a multiple switching device which provides a means of encoding graphical data and/or "X"–"Y" position data directly into digital electrical signals. In this embodiment of the invention, a flexible planar insulating sheet 120 has parallel electrical conductors 122 on its underside that are disposed above and approximately at right angles to a second set of parallel conductors 124 on the upper side (as seen in the Figs) of a relatively rigid substrate 126. Preferably, but not necessarily, the flexible insulating sheet 120 is formed to flow between its conductors 122 until flush with their surfaces, and similarly the rigid substrate 126 is formed to be flush with the upper surfaces of its conductors 124, thereby presenting smooth contiguous planar surfaces. All edges of the resulting assembly are sealed after evacuating the space between planes with a partial vacuum, possible but not necessarily reinforcing said seal by means of an edging strip 128. Switching force may be applied to the resulting assembly by means of a stylus 130, embossed credit cards (not shown), or any other means to apply force to one or more intersections of "X" and "Y" conductors 122 and 124.

Figure 15:
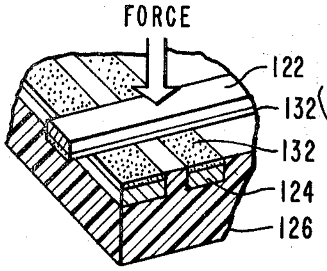
FIG. 15 is a perspective cut-away detail view of one example of the matrix conductors in FIG. 14, utilizing oxidized copper conductors as the FSD switching elements.
Figure 16:
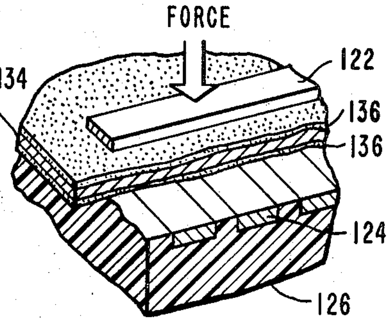
FIG. 16 is a perspective cut-away detail view of another example of the matrix conductors in FIG. 14 utilizing an intermediate barrier layer of thin copper sheet oxidized on both surfaces; and, FIG. 17 is a perspective cut-away detail view of yet another example of the matrix conductors in FIG. 14 utilizing a barrier layer of mechanically entrained cuprous oxide, in accordance with this invention.
Figure 17:
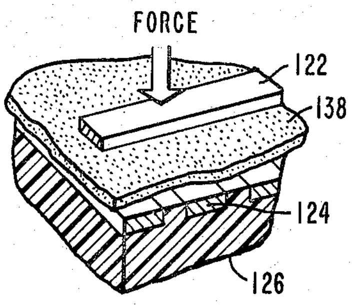

FSD barriers may be formed in any of the three configurations illustrated in FIGS. 15, 16 and 17, with preferred configurations being those in FIGS. 15 and 16. In FIG. 15, the FSD barriers are formed by the direct oxidation of the exposed copper surfaces 132 of conductors 122 and 124, which form the equivalent of a pair of back-to-back diodes at each intersection thereof. When sufficient force is applied to the intersection, the blocking copper/cuprous oxide junction avalanches to provide a conductive path through the resulting matrix array. FIG. 16 utilizes the same matrix conductors, but interposes therebetween a thin copper foil 134 on which both surfaces 136 have been oxidized. Together with the bare copper surfaces of conductors 122 and 124, the oxide coated foil 134 forms the equivalent of two pairs of back-to-back FSD diodes at each intersection of said matrix conductors. When sufficient force is applied at an intersection between said matrix conductors, the dual blocking FSD diodes avalanche to provide a conductive path through the matrix. It is important to form both oxide surfaces 136 thick enough for one junction to block the applied voltage, since the copper foil 134 becomes energized as soon as one junction avalanches; this, in turn, could energize all of the opposed and contiguous conductors through a voltage induced avalanche of all junctions leading out of the foil 134. FIG. 17 illustrates an alternative method, which forms one back-to-back pair of FSD diodes at each matrix intersection. In this embodiment of the invention, a thin layer of cuprous oxide powder 138 is mechanically entrained between the matrix planes, preferably within a thin elastomeric binding agent or a thin layer of open mesh fabric. This method provides the equivalent of a single pair of back-to-back FSD diodes at each intersection of the matrix conductors 122 and 124.

In these matrix systems, it is evident and therefore not shown that the individual barriers at the intersections block current flow from potential sources coupled to the conductors 122, 124. These conductors may be narrow, such as 1/32 inch between centers, so that an extremely fine gridlike division of the planar surface is achieved. The positional data represented by the location of the stylus 130 is by virtue of the piezo avalanche effect, converted to a precise digital signal indication. For other means of applying mechanical force, multiple points may be avalanched simultaneously. Response speed of the circuitry far exceeds the velocity of typical devices used to exert the compressive force, and only light forces need be employed.

While there have been described above and illustrated in the drawings various materials, devices and processes in accordance with the invention, it will be appreciated that the invention is not limited thereto, but encompasses all internal forms and modifications falling within the scope of the appended claims.

What is claimed is:

1. A solid state, pressure-controlled switch for permitting electron flow under an applied voltage in response to an applied force comprising:

at least one copper element; and at least one cuprous oxide element of less than approximately 0.0006 inch and more than approximately 0.0001 inch in thickness in electrical and mechanical contact with said at least one copper element to define a junction therebetween and minutely compressible in response to mechanical stress exerted on at least a portion thereof, the applied voltage being across said copper and cuprous oxide elements and electron flow being from said cuprous oxide element to said copper element, the junction having sufficient voltage blocking capability to prevent electron flow in the unstressed state, and avalanching abruptly to a conductive state when under compressive stress.

2. The invention as set forth in claim 1 above, wherein the switch is responsive to applied force of a predetermined amount, the force being determined as a function of the effective thickness of the cuprous oxide layer and the applied voltage.

3. The invention as set forth in claim 1 above, wherein said cuprous oxide element is of between approximately 0.0002 inch and 0.0006 inch in thickness.

4. The invention as set forth in claim 3 above, wherein the applied voltage is of the order of six volts and the applied force is of the order of a few ounces.

5. The invention as set forth in claim 1 above, wherein said switch comprises a single copper element, a single cuprous oxide element and a non-copper conductive element.

6. The invention as set forth in claim 1 above, wherein said switch comprises at least two regions separated from each other, each region having a copper strata and a cuprous oxide strata in facing and contacting relation defining a junction therebetween.

7. The invention as set forth in claim 6 above, wherein the free electron flow is in the same relative direction in each of the junctions and the switch is unidirectional.

8. The invention as set forth in claim 6 above, wherein the free electron flow is in opposite directions in different ones of the junctions and the switch is bidirectional.

9. The invention as set forth in claim 1 above, wherein said cuprous oxide element comprises a formed layer on said copper element and said formed layer is electrochemically reacted.

10. The invention as set forth in claim 1 above, wherein said cuprous oxide element comprises cuprous oxide powder.

11. A force switchable electrical device having substantially infinite resistance to electron flow in at least a given direction and permitting electron flow with very low voltage drop in said direction only in response to the application of mechanical force in excess of a predetermined amount comprising:

a planar copper base member;

a planar cuprous oxide layer member of less than approximately 0.0006 inch in thickness, said cuprous oxide layer being disposed in contiguous contacting relation to said copper base member and being in electrical circuit therewith at the interfacing junction therebetween, said given direction being from said cuprous oxide layer to said copper base member and said layer member being positioned to receive an applied force; and circuit means coupled to said base member and said layer member for establishing an electrical potential across said junction to provide electron flow in at least the given direction, wherein the effective thickness of said cuprous oxide layer is chosen relative to the applied voltage to switch to permit electron flow in response to forces of levels that may conveniently be manually exerted.

12. The invention as set forth in claim 11 above, wherein said cuprous oxide layer member is between approximately 0.0002 inch and 0.0006 inch in thickness, and wherein the electrical potential is in the range from approximately 5–32 volts.

13. A force switchable electrical element comprising:

a conductive base member having a force bearing copper surface, a film of cuprous oxide of less than 0.0001 inch in thickness, said cuprous oxide film being disposed upon the force bearing surface of said base member and being in electrical circuit therewith, and means disposed to seal said layer against further oxidation.

14. A solid state, bi-directional pressure device comprising:

a substrate;

a pair of thin, conductive coplanar electrodes disposed on said substrate and terminating in end portions separated by a non-conductive gap;

a shunt electrode having a lower surface disposed upon said pair of electrodes and across the separation therebetween, said shunt electrode having an upper surface including a portion for receiving a mechanical force;

a layer of cuprous oxide of less than approximately 0.001 inch in thickness and interposed between the lower surface of said shunt electrode and the facing surface of said pair of electrodes, at least one of said shunt electrode or said pair of electrodes being of copper; and sealant means disposed over said shunt electrode and said pair of electrodes to prevent oxidation and contamination of said cuprous oxide layer.

15. The invention as set forth in claim 14 above wherein said substrate comprises a printed circuit board, wherein the end portions of said pair of electrodes comprise half-disks separated by a gap at least several times the thickness of the layer of cuprous oxide, wherein the shunt electrode is a copper disk element of substantially the same size as said half-disk end portions, wherein said layer of cuprous oxide comprises a deposited layer of between approximately 0.0002 inch and 0.0006 inch in thickness, and wherein said pair of coplanar electrodes support a voltage difference therebetween.

16. A bi-state pressure responsive electrical switch comprising a rigid, hollow non-conductive housing having at least one open end; a first conductive electrode disposed within said housing in contact therewith and having at least a portion disposed adjacent said open end of said housing for receiving a mechanical force; first conductor means coupled through said housing to said first electrode; a second conductive electrode disposed within said housing and in contact therewith, said second electrode being separated from said first electrode by a gap; second conductor means coupled through said housing to said second electrode; and means including a copper strata and a cuprous oxide strata in facing contacting relation defining at least one junction interposed in the gap between said electrodes, and providing a planar surface area positioned to receive mechanical force exerted on said first electrode, the junction comprising a layer of cuprous oxide of less than approximately 0.0006 inch in thickness; and sealant means encompassing at least a portion of said housing to prevent oxidation and contamination therein.

17. The invention as set forth in claim 16 above, wherein said housing comprises an insulating member, and wherein the total cuprous oxide thickness is between approximately 0.0002 inch and 0.0006 inch.

18. The invention as set forth in claim 16 above, wherein said electrodes are copper and wherein said interposed member comprises a cuprous oxide barrier layer.

19. The invention as set forth in claim 16 above, wherein said electrodes are copper, and wherein said interposed member comprises a soft metal conductive disk having thin layers of cuprous oxide powder mechanically entrained therein on the opposite sides thereof, in facing contacting relation to said copper electrodes.

20. The invention as set forth in claim 19 above, wherein said soft metal conductor includes an internal hard conductive element.

21. The invention as set forth in claim 16 above, wherein one of said pair of electrodes is copper and the other is of a non-copper metal, and wherein said copper electrode includes, at the gap region in contact with the other electrode, a thin layer of cuprous oxide material.

22. The invention as set forth in claim 16 above, wherein at least one copper disk is interposed in the gap between said electrodes, the opposite faces of each of said copper disks comprising a layer of cuprous oxide of between 0.0001 inch and 0.0006 inch.

* * * * *

PO-1050
(5/69)

UNITED STATES PATENT OFFICE
CERTIFICATE OF CORRECTION

Patent No. 3,790,870 Dated February 5, 1974

Inventor(s) Robert J. Mitchell

It is certified that error appears in the above-identified patent and that said Letters Patent are hereby corrected as shown below:

On the Title page, after item [21] and before item [52] insert --Related to U. S. Application "Electrical Devices and Materials", Serial No. 724,791, filed April 29, 1968--. Column 1, line 3, before "BACKGROUND OF THE INVENTION" insert --This application is related to my previously filed, now copending patent application entitled "Electrical Devices and Materials", Serial No. 724,791, filed April 29, 1968.-- Column 2, line 6, after "De-switching" insert a comma --,--; line 51, after "switching" insert --of--. Column 3, line 5, after "concentric" insert --conductor--. Column 5, line 6, "thickness" read --thicknesses--; line 37, "copper/-" read --copper/--; line 48, after "in" delete "a". Column 6, line 50, "COnstruction" read --Construction--. Column 10, line 63, "possible" read --possibly--. Column 12, line 13, after "being" delete "determined as a function of" and substitute --selectively variable in accordance with--.

Signed and sealed this 24th day of September 1974.

(SEAL)
Attest:

McCOY M. GIBSON JR.
Attesting Officer

C. MARSHALL DANN
Commissioner of Patents